(12) United States Patent
Sugaya et al.

(10) Patent No.: US 7,821,795 B2
(45) Date of Patent: Oct. 26, 2010

(54) MULTILAYER WIRING BOARD

(75) Inventors: Yasuhiro Sugaya, Osaka (JP);
Yoshiyuki Yamamoto, Osaka (JP);
Toshiyuki Asahi, Osaka (JP);
Katsumasa Miki, Osaka (JP); Masaaki Katsumata, Osaka (JP); Yoshiyuki Saitou, Osaka (JP); Takeshi Nakayama, Hyogo (JP)

(73) Assignee: Panasonic Corporation, Osaka (JP)

( * ) Notice: Subject to any disclaimer, the term of this patent is extended or adjusted under 35 U.S.C. 154(b) by 810 days.

(21) Appl. No.: 11/578,039

(22) PCT Filed: Feb. 1, 2006

(86) PCT No.: PCT/JP2006/301640

§ 371 (c)(1),
(2), (4) Date: Oct. 12, 2006

(87) PCT Pub. No.: WO2006/082838

PCT Pub. Date: Aug. 10, 2006

(65) Prior Publication Data

US 2007/0242440 A1    Oct. 18, 2007

(30) Foreign Application Priority Data

Feb. 3, 2005    (JP) .............................. 2005-027569

(51) Int. Cl.
*H05K 1/18* (2006.01)

(52) U.S. Cl. ..................... 361/761; 361/763; 361/766; 361/523

(58) Field of Classification Search ......... 361/763–766, 361/523–533
See application file for complete search history.

(56) References Cited

U.S. PATENT DOCUMENTS

| 6,370,013 | B1 | 4/2002 | Iino et al. | |
| 6,577,490 | B2 | 6/2003 | Ogawa et al. | |
| 7,126,811 | B2 * | 10/2006 | Hirano et al. | 361/523 |
| 7,319,599 | B2 * | 1/2008 | Hirano et al. | 361/763 |
| 2002/0086561 | A1 | 7/2002 | Ogawa et al. | |
| 2004/0125543 | A1 | 7/2004 | Hirano et al. | |

FOREIGN PATENT DOCUMENTS

| JP | 4-283987 | 10/1992 |
| JP | 2738950 | 1/1998 |
| JP | 10-097952 | 4/1998 |
| JP | 11-220262 | 8/1999 |
| JP | 2001-156211 | 6/2001 |
| JP | 2001-185460 | 7/2001 |
| JP | 2002-246759 | 8/2002 |
| JP | 2002-359160 | 12/2002 |
| JP | 2004-221534 | 8/2004 |

\* cited by examiner

*Primary Examiner*—Tuan T Dinh
(74) *Attorney, Agent, or Firm*—Wenderoth, Lind & Ponack, LLP.

(57) ABSTRACT

A multilayered substrate includes a plurality of circuit boards including a plurality of wiring layers including a grounding layer and a power layer, a solid electrolytic capacitor having an insulative oxide film layer, an electrolytic layer, and a conductor layer sequentially formed on one surface or both surfaces of a foil-like metal substrate, and a conductive substance passing through the circuit board across a thickness thereof. The solid electrolytic capacitor is disposed to be held between the plurality of circuit boards. The conductor layer is connected to a grounding electrode formed on the grounding layer, the foil-like metal substrate being connected to a power electrode formed on the power layer.

8 Claims, 10 Drawing Sheets

MULTILAYER WIRING BOARD

This application is a U.S. national phase application of PCT International Application PCT/JP2006/301640, filed Feb. 1, 2006.

BACKGROUND OF THE INVENTION

1. Technical Field

The present invention relates to a multilayered substrate, a semiconductor unit having a multilayered semiconductor, and an electronic unit using the same.

2. Background Art

With a reduction in the size and an increase in functions of recent electronic units, there have been an ongoing increase in pins and speed and an ongoing trend of high-speed transmission, in semiconductor devices constituting electronic units. A package having semiconductor devices mounted and a large number of passive parts are mounted on printed substrates used for the electronic equipment. Many of these passive parts are capacitor elements. Many of the capacitors are used to smoothen switching noises superposed by supply voltage. These capacitors are also used as de-coupling capacitors, which prevent high-frequency noises generated in a processor from flowing out across the entire printed substrate. The capacitors are also used to prevent voltage drop through the quick supply of much current after a switchover in the operating mode of the processor. To play their role effectively, it is an indispensable condition that these capacitors should reduce the value of equivalent series inductance (ESL). To reduce the ESL, a large number of capacitors are usually wired and mounted in parallel. Stacked ceramic chip capacitors are often used as these capacitor elements. However, ceramic capacitors suffer from a substantial capacity reduction if bias voltage is superposed or if the operating environment of ceramic capacitors reaches high temperatures.

As a measure for reducing power supply noises resulting from semiconductor devices mounted on the electronic unit described above, it is known to mount capacitor elements as close to semiconductor devices as possible. It has been therefore proposed that built-in capacitor elements should be provided in interposer substrates that constitute a semiconductor package. Substrates having built-in chip capacitors are disclosed, for example, in Japanese Patent Unexamined Publication No. 2001-185460 and JP-A-11-220262. As disclosed in Japanese Patent No. 2738590, other multilayered substrates are proposed, where capacitor elements function as de-coupling capacitors, positively utilizing dielectric layers held between conductive foils as capacitive layers. Meanwhile, a case is disclosed in JP-A-10-97952 and Japanese Patent Unexamined Publication 2002-359160, where built-in sheet capacitors such as aluminum electrolytic capacitors having a large capacity are provided in printed substrates.

Figure 10:
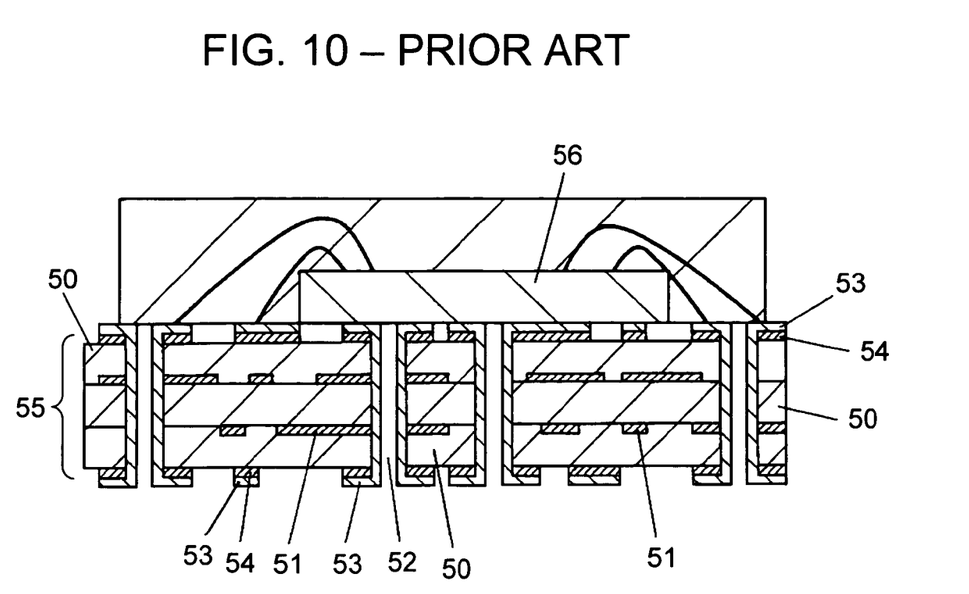
FIG. 10 is a cross-sectional view showing the configuration of a conventional multilayered substrate.

As multilayered substrates used in packages, glass-epoxy multilayered substrates as shown in FIG. 10 are widely used. Glass-epoxy multilayered substrate 55 is composed of insulating layer 50 having epoxy resin impregnated and hardened in a glass woven fabric as a reinforcing material and wiring pattern 51 formed on both sides of insulating layer 50. Wiring pattern 51 is composed of a copper foil and insulating layer 50 is also formed on wiring pattern 51. Through holes 52 are formed in glass-epoxy multilayered substrate 55 and copper layers 53 are formed inside walls of through holes 52 by a plating technique. Wiring pattern 54, which is composed of a copper foil, is formed on the top layer of glass-epoxy multilayered substrate 55. Glass-epoxy multilayered substrate 55 is also called a multilayered substrate formed through a plated through hole technique. Multilayered substrates formed through a plated through hole technique can be mass produced at low cost, being very widely used as interposer substrates as well. If, in addition, semiconductor devices 56 are mounted by a wire bonding technique, multilayered substrates formed by the aforementioned plated through hole technique are often used.

If semiconductor devices are mounted through flip chip mounting, where semiconductor devices are connected through wiring-layer pad electrodes and solder bumps or Au bumps, wiring with higher density is demanded. Therefore, buildup multilayered printed substrates (hereinafter, referred to as "buildup substrates") using a buildup technique have also been developed. Buildup substrates are formed by using a glass-epoxy multilayered substrate as a core substrate, building up insulating layers on the core substrate, which have wiring patterns formed, and connecting wiring patterns between upper and lower layers by means of a via. On buildup substrates, connections can be made through a via at necessary points between upper-layer and lower-layer wiring patterns, thus reducing space for the connecting via. As a result, this makes it possible to reduce the diameter of the via and make line widths and intervals microscopic. Therefore, high-density wiring can be realized. Vias, used to make connections between layers on the buildup substrate, are usually formed by plating. However, buildup substrates have been developed where vias are formed using conductive paste without using plating. For example, ALIVH (registered trademark) and $B^2$ it are available as buildup substrates using conductive paste, which have no core substrate and all layers are built up.

To improve the electrical properties of an electronic unit including semiconductor devices of interest, it is necessary to mount a large number of capacitor elements including de-coupling capacitors on a printed substrate. The large number of parts makes it difficult to reduce the size and cost of electronic units.

As shown in FIG. 10, semiconductor packages using glass-epoxy multilayered substrates and wire bonding mounting, currently used widely, do not require much attention to the length of wiring including wires if these packages are used in applications where semiconductors operate at speeds of 100 MHz or less. However, semiconductor packages where large amounts of information need be transmitted as semiconductors used for imaging systems do require a large number of noise-preventing capacitors to be mounted for proper operation. Therefore, these semiconductor packages have a large number of parts. For de-coupling capacitors mounted on mother boards, for example, efforts are made to reduce equivalent series inductance (ESL) by connecting a large number of de-coupling capacitors in parallel. Therefore, a large number of parts are inevitably used. If, in addition, chip capacitors formed by sintering ceramic are used as de-coupling capacitors, a large number of de-coupling capacitors need to be mounted, taking the temperature characteristics of capacitive values into consideration.

As a measure for reducing power supply noises resulting from semiconductor devices, it has also been proposed that built-in capacitor elements should be provided on interposer substrates, which constitute a semiconductor package, aiming to form capacitive elements as close to semiconductor devices as possible. As disclosed in Japanese Patent No. 2738590, for example, a multi-layered substrate has been proposed where dielectric layers made of resin material, which are held between conductive foils, are positively used as capacitive layers and function as de-coupling capacitors. With this construction, however, the capacitive layers are made of resin and have a few tens of levels of relative permittivity, which makes it impossible to form a large-capacity capacitor. Therefore, the above-mentioned type of de-coupling capacitor has a de-coupling function, but cannot store sufficient charges to serve to smoothen noises such as switching noises superposed by supply voltage or prevent voltage drop through the quick supply of much current after a switchover in the operating mode of the processor. In other words, there is a limit to this type of de-coupling capacitors if thought is given to how many parts help to reduce noises. If, in addition, semiconductors operate faster, an interposer substrate having built-in capacitor elements ends up being an interposer with built-in capacitors that is incapable of addressing a challenge of more stable supply voltage. If, in addition, a plurality of electrodes exist in a single flat dielectric layer, the use of one power supply system is not problematic. However, the use of a plurality of power supply systems will raise a problem that individual power supply noises propagate through dielectric layers.

As means for providing built-in large-capacity capacitors, a construction where built-in chip capacitors are used is therefore available, as disclosed in JP-A-11-220262. Chip-capacitor electrodes are usually on the same plane and it is necessary to form a power-supply electrode and a grounding electrode of a substrate built-in on the same plane. Normally, a power layer and a grounding layer are often on different layers. Thus, there is a problem that a substantial design change is requested so that built-in chip capacitors are provided.

It has also been proposed, as disclosed in Japanese Patent Unexamined Publication No. 2001-185460, that built-in capacitors can be provided using spaces between power layers and grounding layers by mounting chip capacitors vertically. Even in this case, however, a design change around chip parts is inevitable, which remains problematic. In addition, the vertical burial and mounting of chip parts raise a problem that the thickness between the power layer and the grounding layer is 0.6 mm even if small 0603-size (unit: mm) chips are used, thus resulting in a thick interposer substrate itself.

It has also been proposed, as disclosed in JP-A-10-97952 and Japanese Patent Unexamined Publication No. 2002-35916, that a single built-in aluminum electrolytic capacitor is provided on a substrate as means for providing a relatively thin large-capacity built-in capacitor element. However, it is thought as a prerequisite that the use of the built-in aluminum electrolytic capacitor necessitates a design change for an interposer.

SUMMARY OF THE INVENTION

The present invention considers the problems described above.

A multilayered substrate according to the invention includes a plurality of circuit boards including a plurality of wiring layers including a grounding layer and a power layer, a solid electrolytic capacitor having an insulative oxide film layer, an electrolytic layer, and a conductor layer sequentially formed on one surface or both surfaces of a foil-like metal substrate, and a conductive substance passing through the circuit board across a thickness thereof. The solid electrolytic capacitor is disposed to be held between the plurality of circuit boards. The conductor layer is connected to a grounding electrode formed on the grounding layer, the foil-like metal substrate being connected to a power electrode formed on the power layer.

DETAILED DESCRIPTION OF THE PREFERRED EMBODIMENTS

Embodiments of the present invention will be described with reference with the drawings. To simplify the description, components with the same functions are essentially shown with the same reference numerals. The invention is not limited to the embodiments that will be described below.

First Embodiment

Figure 1:
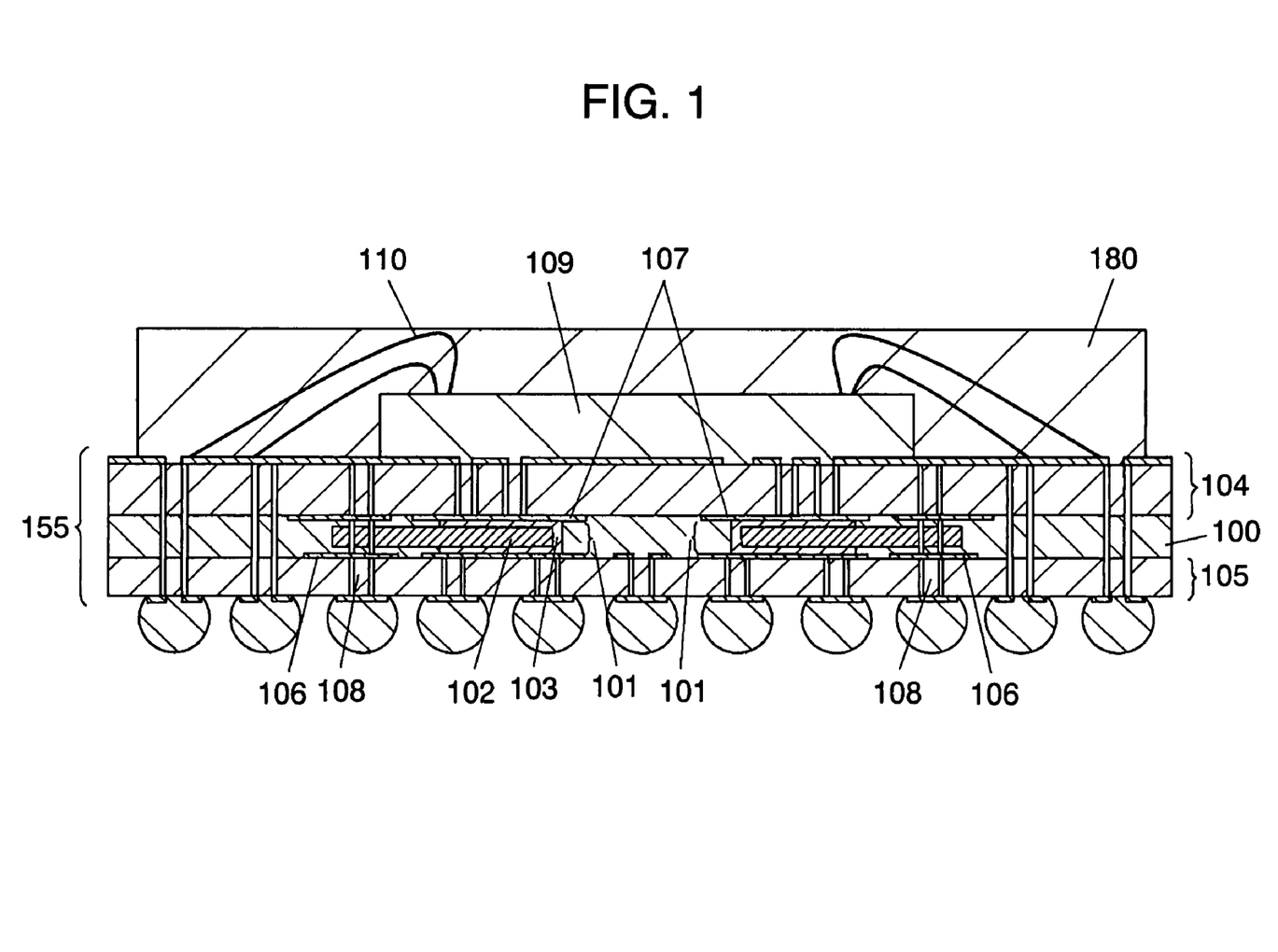
FIG. 1 is a cross-sectional view of a multilayered substrate of an example according to a first embodiment of the present invention.

A first embodiment of the invention will be described with reference to FIGS. 1, 2A, 2B, 3A, and 3B. FIG. 1 is a cross-sectional view of a multilayered substrate of a first example according to a first embodiment of the invention. As shown in FIG. 1, semiconductor device (semiconductor chip) 109 is connected to glass-epoxy multilayered substrate 155 by a wire bonding method and sealed with resin 180. In other words, the multilayered substrate shown in FIG. 1 is also an intermediate substrate or an interposer for connecting the semiconductor device to a mother board in a semiconductor package. Glass-epoxy multilayered substrate 155 also functions as an interposer. As shown in FIG. 1, glass-epoxy multilayered substrate 155 is a four-layer-wiring multilayered substrate. Glass-epoxy multilayered substrate 155 is composed of glass-epoxy substrate 104 and glass-epoxy substrate 105. A first wiring layer is formed on the upper surface of glass-epoxy substrate 104 and a second wiring layer is formed on the lower surface thereof. A third wiring layer is also formed on the upper surface of glass-epoxy substrate 105 and a fourth wiring layer is formed on the lower surface thereof. Solid electrolytic capacitor 101 is formed between the second and third wiring layers. Solid electrolytic capacitor 101 is inserted and embedded between glass-epoxy substrate 104 and glass-epoxy substrate 105.

For solid electrolytic capacitor 101, between the second and third wiring layers of multilayered substrate 155, an insulative oxide film layer, an electrolytic layer, and conductor layer 103 are sequentially produced and formed on both surfaces of foil-like metal substrate 102 and embedded in composite layer 100. Conductor layer 103 is connected to grounding electrode 107 of multilayered substrate 155 and foil-like metal substrate 102 is connected to power electrode 106 of multilayered substrate 155. Grounding electrode 107 is formed on the second layer of multilayered substrate 155 while the power electrode is formed on the third layer of multilayered substrate 155.

The connections mentioned above may be made using conductive resin adhesive. In this embodiment, foil-like metal substrate 102 is connected to power electrode 106 using through hole plating 108 passing through multilayered substrate 155 across a thickness thereof. Through hole plating 108 passing through the substrate across the thickness thereof shown in this embodiment has a via construction. However, conductive via paste may be charged for interlayer connection and to connect foil-like metal substrate 102 to power electrode 106. The through hole plating and its alternative, the conductive via paste, are referred to generically as a "conductive substance".

In a semiconductor package using current system LSIs, a system is often composed of a plurality of power supply systems. It is therefore necessary to form capacitors according to the number of power supply systems. In this case, the number of power supply systems can be addressed by forming power electrodes corresponding to power supply systems on the wiring layer of multilayered substrate 155. In this case, it is preferable that the wiring layer where power electrodes are to be formed should be divided into regions corresponding to power supply systems and that electrodes for the same power supply systems should be formed in the same regions.

Foil-like metal substrate 102 has a large number of microscopic porous portions, which are formed by roughening and making one side of an aluminum foil porous by etching to increase the surface area thereof before oxidizing the surface to form a dielectric film, which is an oxide layer. A large number of microscopic porous portions are normally formed by means of etching and a thin dielectric film is formed on the surface of the portion by oxidization. The dielectric film functions as a dielectric. Inside the microscopic porous portion, a solid electrolytic layer is formed for electrical continuity by chemical polymerization and electrolytic polymerization using a functional polymer layer such as polypyrrole and polythiophene. A collector layer is formed on the solid electrolytic layer. Portions of foil-like metal substrate 102 that have not yet been subjected to etching, together with the collector layer, serve as electrodes and function as capacitors.

An aluminum foil is used as foil-like metal substrate 102 in this embodiment. However, a material that allows a a dielectric layer to be similarly formed on the surface thereof, a resin material, and a material that allows a dielectric layer to be formed by film techniques such as sputtering also provide similar effect if the material is shaped like a sheet.

In this embodiment, solid electrolytic capacitor 101 is embedded in composite sheet 100. However, the capacitor may be embedded in any selected one of a composite layer having thermosetting resin impregnated in heat-resistant organic unwoven fabric as a reinforcing material, a composite sheet composed of an inorganic filler and thermosetting resin, or a composite sheet having thermosetting resin impregnated in woven glass fiber as a reinforcing material. Epoxy resin is used as thermosetting resin.

Composite sheets using heat-resistant organic fiber include composite sheets having epoxy resin used as thermosetting resin in unwoven aramid resin fiber, for example, which is characterized by its small coefficient of thermal expansion. If prepreg using epoxy resin as thermosetting resin in unwoven aramid resin fabric is used, the laminating pressure is about 5 MPa with the composite sheet filled with inner via paste. Therefore, solid electrolytic capacitors 101 are embedded without being damaged.

Composite sheet 100 used in this embodiment is composed of an inorganic filler and thermosetting resin. Therefore, the heat transfer coefficient of the composite sheet is improved making good use of the properties of the inorganic filler, which allows heat from semiconductor device 109 surface mounted to leave effectively. Inorganic filler materials include $Al_2O_3$, $SiO_2$, MaO, BN, and AlN, for example. Various physical properties can be controlled through the selection of an inorganic filler material. In addition, built-in solid electrolytic capacitors 101 can be provided without being damaged during an incorporation process involving melting and softening during thermal pressing because the composite sheet has no reinforcing material such as glass fiber. The composite sheet also suffers from little damage to built-in elements when being subjected to thermal shock because the composite sheet's property value such as thermal expansion coefficient is three-dimensionally isotropic.

It is also preferable that the elasticity modulus of composite sheet 100 having solid electrolytic capacitors 101 built in should be small or 10 Gpa or less although the elasticity modulus of composite sheet 100 can be selected freely by selecting a thermosetting epoxy material.

However, the invention is not limited to a composite sheet material for a material for forming a built-in capacitor layer. For example, glass-epoxy prepreg is used and epoxy resin oozing due to pressing may be impregnated. Resin material is not limited.

A composite sheet filled with flexible inner via paste is used between glass-epoxy substrate 104 and glass-epoxy substrate 105 for laminating purposes. In this case, through hole plating vias need not be formed. Use of through hole plating vias or conductive inner via paste for interlayer connections is determined in view of re-wiring design such the number of layers and via pitches required or process costs for interlayer connections.

In the case of the first embodiment, multilayered substrate 155 has glass-epoxy substrate 104, glass-epoxy substrate 105, and composite sheet 100 laminated, which composite sheet is made of material different from those of glass-epoxy substrate 104 and glass-epoxy substrate 105. However, the composite sheet is held between the two glass-epoxy substrates symmetrically with little substantial warpage.

A four-layer substrate is used as an interposer. However, the invention is not limited to a four-layer substrate but any of a two-layer substrate, a three-layer substrate, a four-layer substrate, and a six-layer substrate may be used.

A method for providing built-in solid electrolytic capacitors 101 and the construction of connections for connecting power electrode 106 and grounding electrode 107 of a glass-epoxy substrate to solid electrolytic capacitor 101 will be described below with reference with FIGS. 2A, 2B, 3A, and 3B.

Figure 2A:
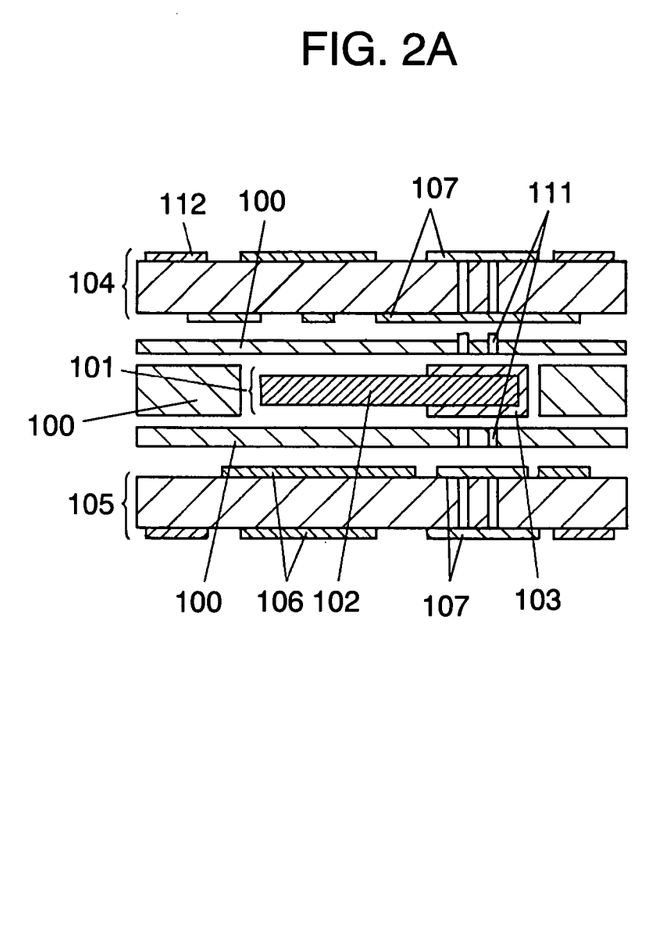
FIG. 2A is a cross-sectional view for describing a method for producing a multilayered substrate of another example according to the first embodiment of the invention.
Figure 2B:
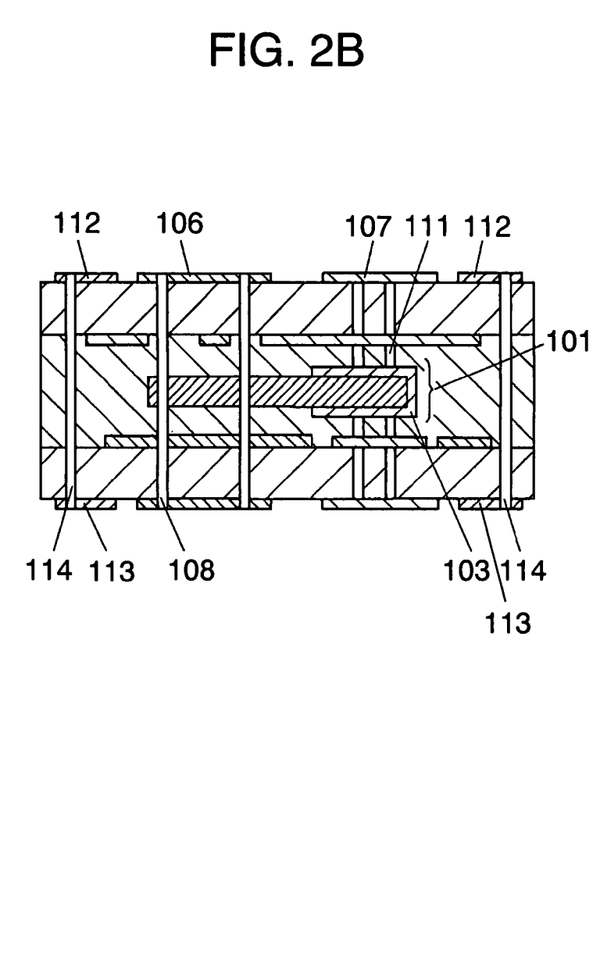
FIG. 2B is a cross-sectional view for describing a method for producing a multilayered substrate of another example according to the first embodiment of the invention.

FIGS. 2A and 2B are cross-sectional views for describing a method for producing a multilayered substrate, according to the embodiment. FIG. 2A is a cross-sectional view of a multilayered substrate before lamination and FIG. 2B is a cross-sectional view of a multilayered substrate after lamination.

In the methods shown in FIGS. 2A and 2B, grounding electrode 107 of a glass-epoxy substrate is connected to conductor layer 103 of solid electrolytic capacitor 101 using conductive via paste 111 charged into composite sheet 100. Solid electrolytic capacitor 101 is brought into close contact with glass-epoxy substrates 104 and 105 through adhesive composite sheet 100, with no peels at the time of reflow after moisture absorption. As apparent from FIG. 2A, composite sheet 100 is composed of a sheet for sandwiching capacitor 101 and a building-in composite sheet disposed at the periphery of capacitor 101. As shown, substrates 104 and 105 and composite sheet 100 are heated with capacitor 101 sandwiched therebetween. In other words, the composite sheet melts and softens, permitting the composite sheet to bury the capacitor therein without giving internal pressure to the capacitor before the sheet hardens.

It should be noted in terms of construction that a short circuit will result between conductor layer 103, which is a grounding electrode, and a power electrode 106 if an attempt is made to apply a wiring pattern of the multilayered substrate (interposer substrate) having only a rewiring function as it is. This is because capacitor 101 has an insulative oxide film layer, an electrolytic layer, and conductor layer 103 sequentially formed on both surfaces of an aluminum-foil-like metal substrate 102. The wiring pattern has therefore been studied paying attention to each of a power line and a grounding GND line. As a result, grounding electrode 107 insulated and separated from the power electrode is newly provided in the third layer (a wiring layer on the upper surface of glass-epoxy substrate 105), which is an electrolytic layer, to electrically connect conductor layer 103 of solid electrolytic capacitor 101 to the grounding electrode provided in the third layer of the multilayered substrate. The construction described above allows connection with the grounding electrodes on both of the upper and lower surfaces and strengthens grounding, which is preferable in terms of a measure against noises.

As a method for avoiding a short circuit between conductor layer 103 and the third layer of the multilayered substrate, which is a power electrode, solid electrolytic capacitor 101 may be simply insulated from the third layer of the multilayered substrate using an insulating sheet or insulating paste. In this case, a built-in capacitor can be provided without a change to the design of the interposer (multilayered substrate) having a rewiring function only.

If consideration is given to a wiring distance from the pad electrode of a semiconductor device to a capacitor electrode, the thickness of composite sheet 100, which is an adhesive sheet, leads to an increase in the wiring distance. Therefore, a slight increase in ESL value results because of the wiring length. It is therefore preferable that the composite sheet 100 and conductive via paste should be as thin as possible. It is desired that a composite sheet preferably 50 μm or less in thickness should be used.

Aluminum-foil-like metal substrate 102, which is an anode, is connected to power electrode 106 of the glass-epoxy substrate using through hole plating 108.

A specific method for manufacturing a multilayered substrate will be described below. Heating and pressing is performed on glass-epoxy substrate 104 and glass-epoxy substrate 105 so that solid electrolytic capacitor 101 is embedded in a composite sheet. When the thermosetting epoxy resin of the composite sheet has melted and softened, pressing is performed at a pressure of approximately 2 to 4 MPa so that solid electrolytic capacitor 101 is embedded. Heating temperatures from approximately 80 to 200° C. are used so that the composite sheet hardens completely. During the heating and pressing process described above, solid electrolytic capacitor 101 is embedded through composite sheet 100 filled with inner via paste 111. Therefore, both solid electrolytic capacitor 101 of the substrate and electrode 103 of solid electrolytic capacitor 101 are connected to the metal substrate through inner via 111. A through hole is then formed using a drill and a through hole plating process is performed. At the time of the plating process, wiring patterns have already been formed on the surface layer of the layered substrate. Thus, resists are formed in these regions before the plating process is performed. As a result, power electrode 106 (power line) is connected to an aluminum field foil (i.e., foil-like metal substrate 102), which is the anode portion of solid electrolytic capacitor 101, by means of through hole 108. Because the aluminum field foil is approximately 70 μm thick, sufficient connection reliability can be ensured between the aluminum field foil and the through hole plating.

For the signal line, a signal electrode 112 formed in the first wiring layer is connected to a signal electrode 113 formed on the fourth wiring layer via through hole 114. Because through hole 114 passes through only a dielectric layer having a single and low relative permittivity without passing through solid electrolytic capacitor 101, which is a capacitive layer, a signal hardly deteriorates at the through hole 114 portion.

Figure 3A:
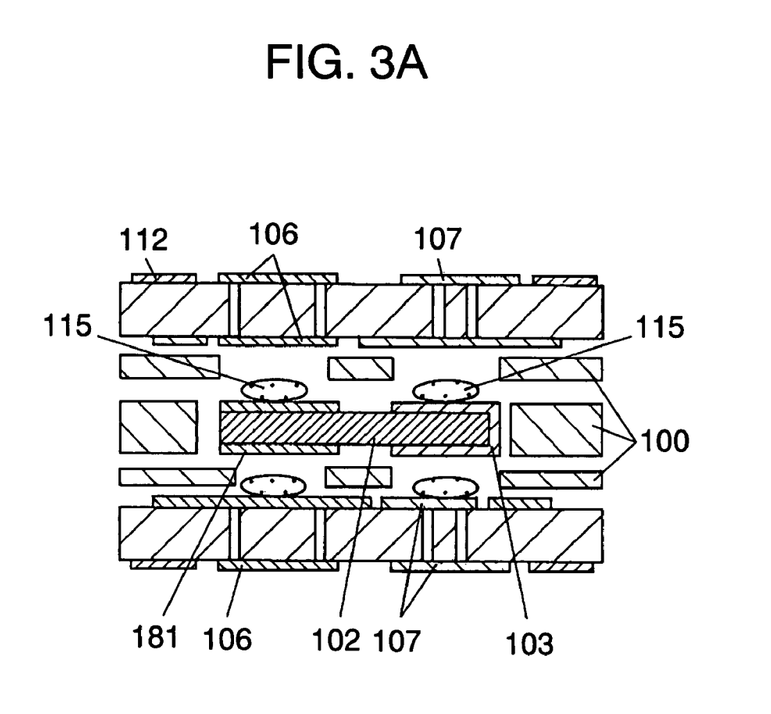
FIG. 3A is a cross-sectional view for describing a method for producing a multilayered substrate of yet another example according to the first embodiment of the invention.
Figure 3B:
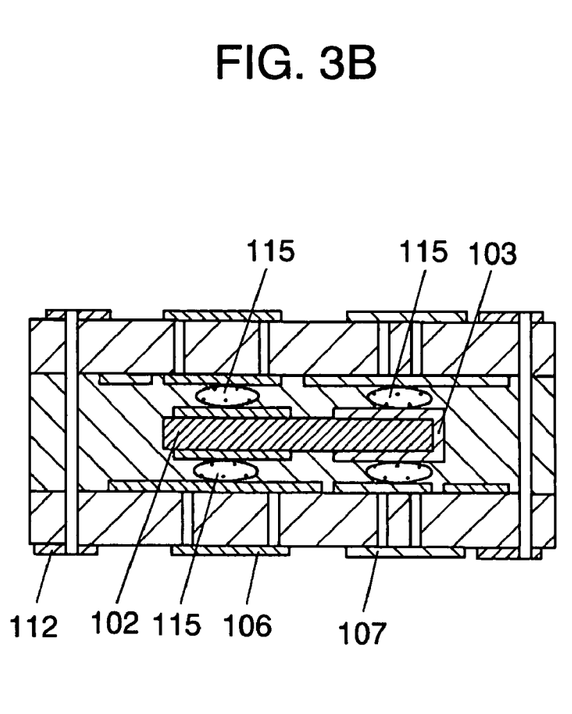
FIG. 3B is a cross-sectional view for describing a method for producing a multilayered substrate of yet another example according to the first embodiment of the invention.

A multilayered substrate according to another example will be described below with reference to FIGS. 3A and 3B. FIG. 3A is a cross-sectional view of a multilayered substrate before lamination and FIG. 3B is a cross-sectional view of a multilayered substrate after lamination. In this example, power electrode 106 (power line) is connected to an aluminum field foil (i.e., foil-like metal substrate 102), which is the anode portion of solid electrolytic capacitor 101, using conductive resin paste 115. It should be noted that a sufficient low-resistance connection cannot be obtained because of the aluminum oxide film when the metal substrate 102 composed of an aluminum foil is brought into direct contact with conductive resin paste 115. Plating film 181 that is difficult to be oxidized is therefore formed on the surface portion of metal substrate 102. A sufficient low-resistance connection can be endured, for example, by applying Au plating, Ag plating, and Ni plating to the surface of metal substrate 102. In this example, an interface gap between solid electrolytic capacitor 101 and glass-epoxy substrate 104 and 105 is filled with adhesive conductive resin paste 115 instead of composite sheet 100 of the example shown in FIGS. 2A and 2B. With the configuration described above, a shorter distance can be provided between a semiconductor device mounted on glass-epoxy substrate 104 and solid electrolytic capacitor 101. Therefore, ESL components due to a wiring length can be reduced.

The summary of the features of the first embodiment, including the ones described above, is as follows:

In the embodiment, mass-produced solid electrolytic capacitor 101 having a large capacity of 10 µF can be used, which is not sealed with resin (size B: 3.5 mm L×2.8 mm W, size D: 7.3 mm L×4.3 mm W). Therefore, solid aluminum electrolytic capacitors before mold (before resin sealing) can be obtained easily. The number of production processes before the provision of built-in solid electrolytic capacitors can be reduced substantially. The thickness of a layer for providing built-in capacitors can also be reduced to 300-um-or-less levels by providing built-in solid aluminum electrolytic capacitors before molding.

With the construction described above, an insulative oxide film layer, an electrolytic layer, and conductor layer 103 are sequentially produced on both surface of aluminum-foil-like metal substrate 102 to form solid electrolytic capacitor 101. The capacitive effect for two layers per area is obtained and a desired large-capacity capacitor element is obtained in a very small area. For example, a capacity of 1 µF or more is required for a power supply system that requires relative current for image-related system LSIs. Under the above specifications, solid electrolytic capacitor 101 having the configuration described above has a sufficiently large capacity and a desired capacity can be ensured in a small area.

In terms of performance, an effect where magnetic fields resulting from the supply of electric charges negate each other is produced, which makes it possible to realize low-ESL capacitor elements. It is because the insulative oxide film layer, the electrolytic layer, and conductor layer 103 are sequentially produced on both surface of aluminum-foil-like metal substrate 102. In addition, a capacitor can be connected to a semiconductor pad electrode with the shortest wiring by providing a built-in capacitor element in glass-epoxy multi-layered substrate 155. As a result, wiring covers a smaller area and radiation noises can be reduced.

In addition, a large capacity can be formed in a small region by using solid electrolytic capacitor 101 in a capacitor-forming region.

An interposer having only a rewiring function can also be designed with little change to wiring by disposing solid electrolytic capacitor 101 between the power layer and the grounding layer and by connecting a foil-like metal substrate to the power electrode of the multilayered substrate using through hole vias or conductive resin material.

In other words, in terms of a semiconductor package, a built-in capacitor can be provided in using the same number of layers and the same pin arrangement as a conventional interposer having a rewiring function. The semiconductor package can share a conventional mother board and perform function evaluation. This is important for the new introduction of an interposer having built-in capacitors.

In addition, a built-in capacitor element having a large capacity in the order of µF can be provided on the substrate. As compared with an interposer having only a rewiring function, a multilayered substrate according to the embodiment can combine almost all of further noise reduction effect of a semiconductor device mounted, and capacitor functions as a measure against noises. Therefore, the number of parts for the electronic unit can be reduced.

Second Embodiment

A second embodiment of the present invention will be described below with reference to FIGS. 4 to 9D.

To simplify the description, in this embodiment, the same components as described in the first embodiment will not be described below.

Figure 4:
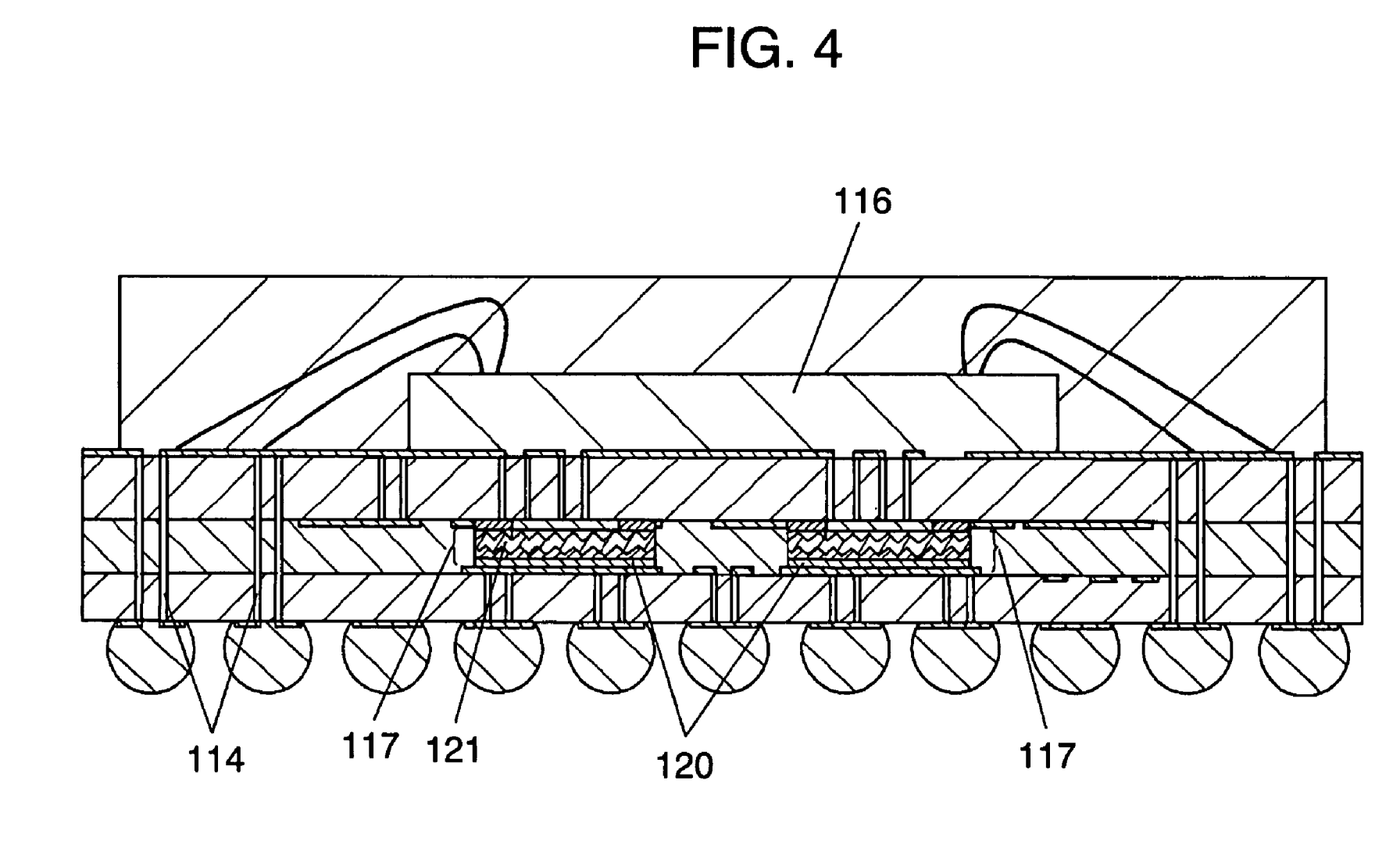
FIG. 4 is a cross-sectional view of a configuration of a multilayered substrate of an example according to a second embodiment of the invention.
Figure 5:
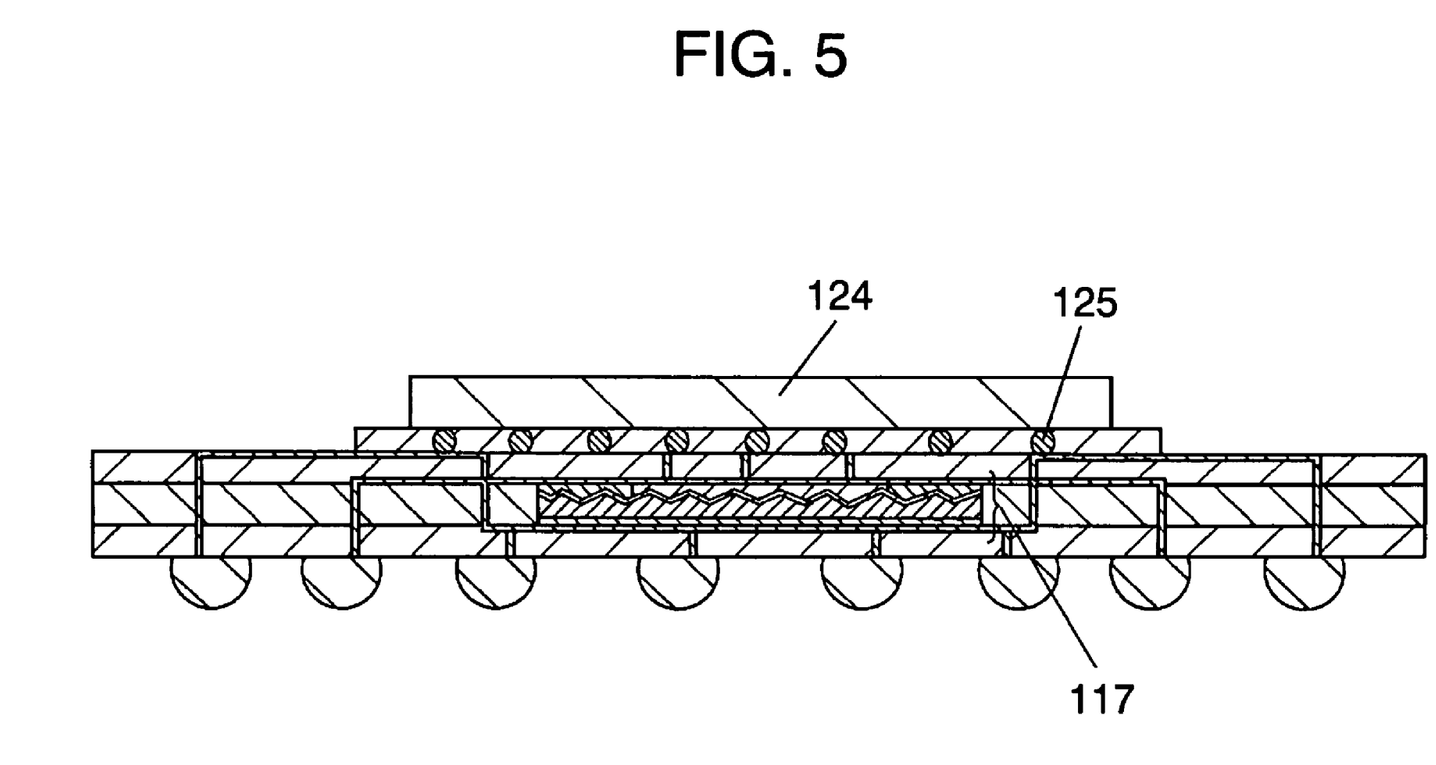
FIG. 5 is a cross-sectional view of a configuration of a multilayered substrate of another example according to the second embodiment of the invention.
Figure 6A:
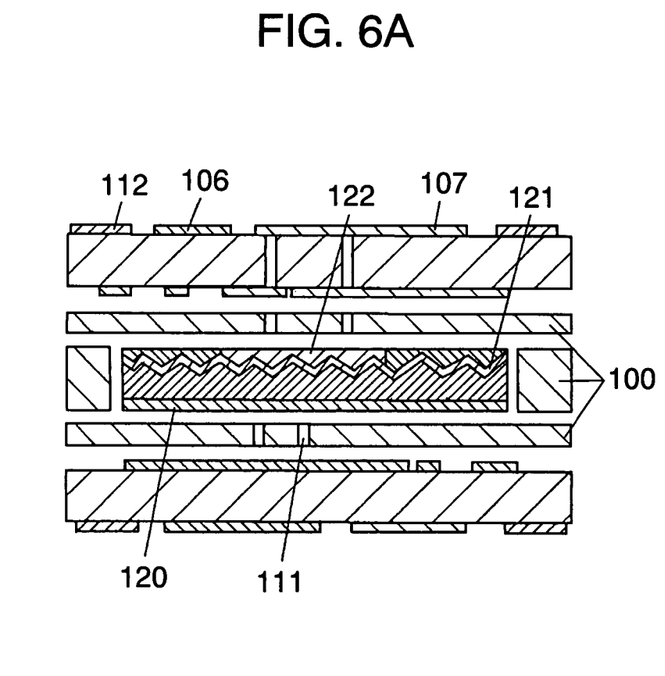
FIG. 6A is a process cross-sectional view for describing a method for producing a multilayered substrate according to the second embodiment of the invention.
Figure 6B:
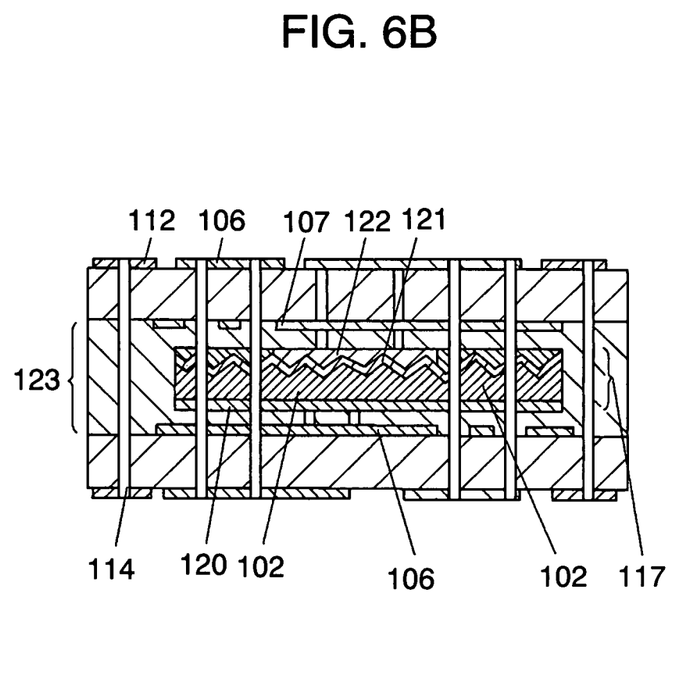
FIG. 6B is a process cross-sectional view for describing a method for producing a multilayered substrate according to the second embodiment of the invention.
Figure 7A:
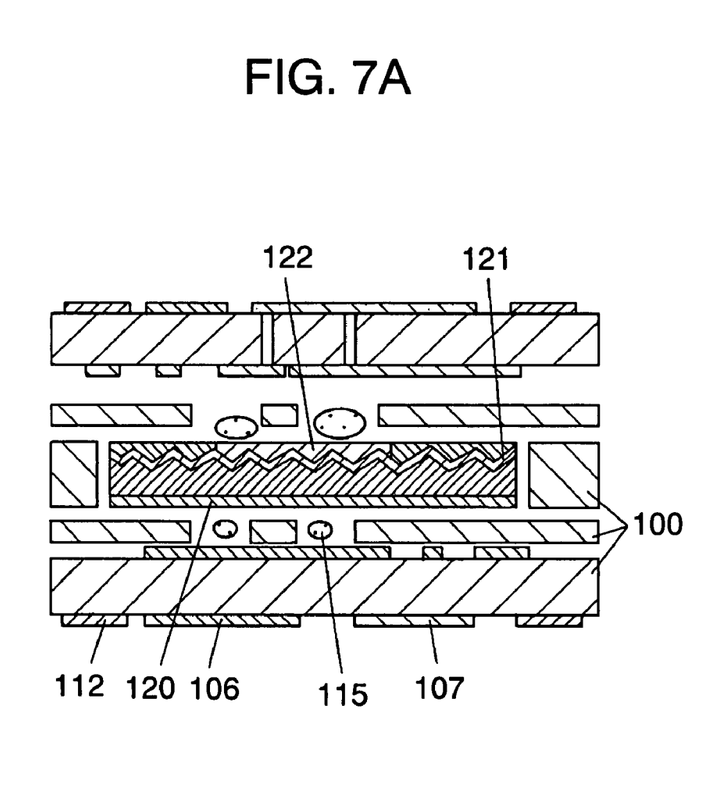
FIG. 7A is a process cross-sectional view for describing a method for producing a multilayered substrate according to the second embodiment of the invention.
Figure 7B:
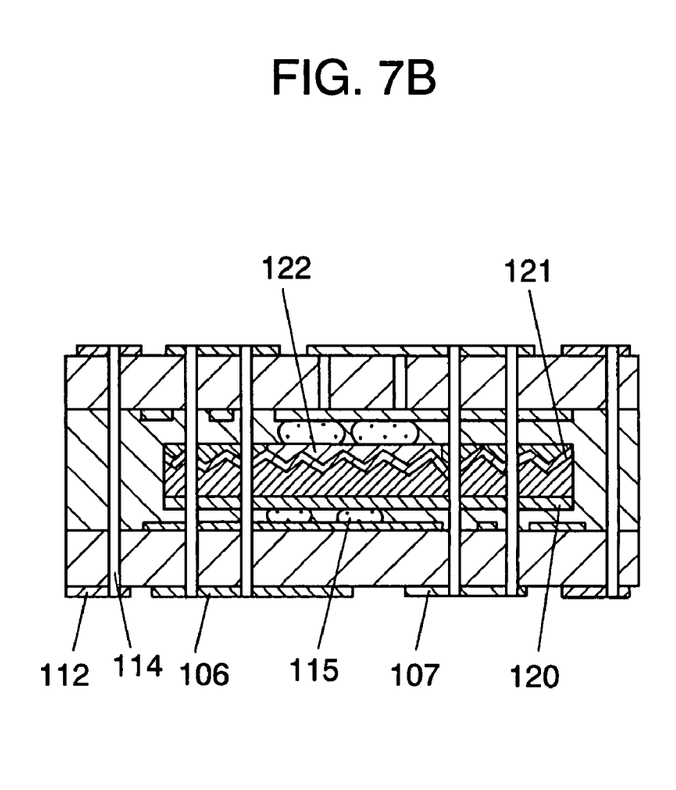
FIG. 7B is a process cross-sectional view for describing a method for producing a multilayered substrate according to the second embodiment of the invention.

FIGS. 4 and 5 are cross-sectional views of a multilayered substrate according to a second embodiment of the invention. FIGS. 6A, 6B, 7A, and 7B are views for describing a method for providing a built-in solid electrolytic capacitor and the construction of a connection for connecting the power electrode and grounding electrode of a glass-epoxy substrate to a solid electrolytic capacitor.

Solid electrolytic capacitor 117 according to the second embodiment is different from solid electrolytic capacitor 101 according to the first embodiment. As shown in FIGS. 4 and 5, solid electrolytic capacitor 117 has an insulative oxide film layer, an electrolytic layer, and a conductor layer sequentially produced and form only one surface of a foil-like metal substrate.

As shown in FIGS. 6A, 6B, 7A, and 7B, the same number of layers, electrode construction, and wiring patterns as a conventional interposer having only a rewiring function can be utilized without a change for electrodes separated into an upper portion and a lower portion. In other words, electrode portion 120 having an aluminum foil or portion plated with Ni or Cu, which aluminum foil or portion is the anode side of solid electrolytic capacitor 117, is connected to power electrode 106 of an interposer substrate. Conductor layer 122, which is the grounding electrode side of capacitor 117, is connected to grounding electrode 107 of the interposer substrate. Individual electrodes are connected in two manners as in the first embodiment. Individual electrodes are connected using composite sheet 100 filled with inner via paste 111 or conductive resin paste 115.

The second embodiment is characterized by the use of capacitor 117 having dielectric layer 121 formed on only one side of the substrate. Therefore, capacitor 117 can be formed to be thinner than solid electrolytic capacitor 101 shown in FIG. 1, which has a dielectric layer on both sides of the substrate. With the configuration described above, the thickness of the capacitor itself can also be reduced to 100 µm or less, thus making it possible to reduce the thickness of built-in capacitor 123 itself to 200 µm or less as well.

In this way, a semiconductor package using an interposer having a capacitor built in, which uses the construction in the second embodiment, will have a construction as shown in FIG. 4. As also shown in FIGS. 6A, 6B, 7A, and 7B, signal line 114 can easily avoid passing through dielectric layer 121. Even with the construction described above, the signal line can be pulled around while maintaining the quality of the signal line. As a result, wiring covers a smaller loop area and noises such as radiation noises can be reduced because of the effect with which capacitor 117 can be disposed close to semiconductor device 116.

It is preferable that a flip chip should be mounted semiconductor device 124 toward a future increase in the operating speed of system LSIs as shown in FIG. 5. The distance between the semiconductor device and the substrate electrode is 50 µm or less because of bump 125, which allows a substantial reduction in wiring length. A clock with a frequency of 500 MHz can also be addressed. In other words, ESL components resulting from wires in wiring bonding mounting can be eliminated.

An interposer substrate (multilayered substrate) according to the invention is also effective for the mounting form described above. Capacitors having a small low ESL can be provided to high-speed semiconductor devices 124 by providing built-in capacitor 117 between the power layer and the grounding electrode layer. The construction described above allows sufficient electric charges to be fed to a semiconductor device operating at 1 GHz or more as well. Therefore, stable supply voltage can be fed to a semiconductor device.

On the whole, a built-in capacitor element having a large capacity in the order of μF can be provided on the substrate. As compared with an interposer substrate having only a rewiring function, the stability of supply voltage in a semiconductor device mounted (stability both inside the semiconductor and outside a mother board) and further noise reduction effect can be obtained. A semiconductor package having a built-in capacitor according to the invention can combine almost all of capacitor functions as a measure against noises. Therefore, the number of parts for the electronic unit can be reduced. In the case of the image system of a digital TV set, for example, nearly 50 capacitors are normally disposed on the main board so that the system LSIs of an image engine operate properly. If the semiconductor package having built-in capacitors or a semiconductor device according to the invention is used in the image system mentioned above, the number of capacitors to be mounted on the main board can be substantially reduced to about 5, or ⅒ as much. For specific applications of the semiconductor package having built-in capacitors according to the invention, it is preferable that the semiconductor package according to the invention should be, among various types of modules (e.g., GPS modules, camera modules) and portable electronic units, applied to cell phones, which are strictly limited in mounting area. Needless to say, the semiconductor package according to the invention can be used in other portable electronic units (for example, PDAs, digital cameras) in a preferable manner.

Although the embodiments of the present invention have been described above, the description herein is not limiting but, needless to say, various modifications can be made. For example, the configuration of each of the embodiments and a modification to each can be applied mutually.

A wiring pattern of each of the layers of a four-layer interposer substrate will be described below.

Figure 8A:
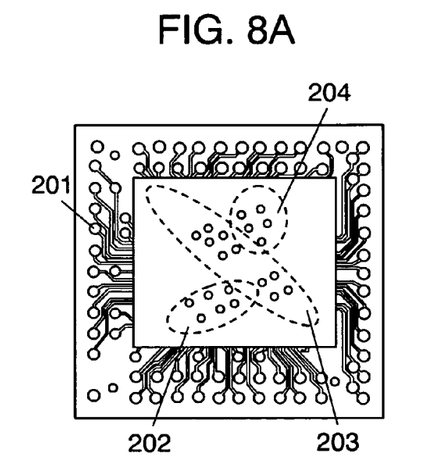
FIG. 8A is a plan view for describing a wiring pattern on a multilayered substrate.
Figure 8B:
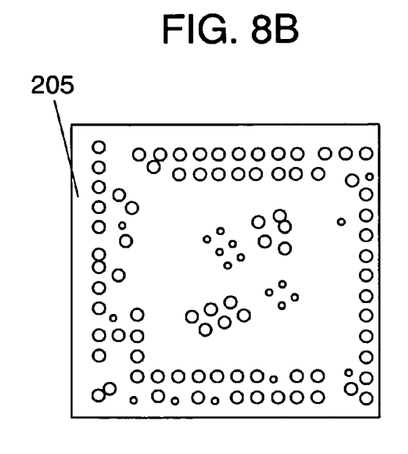
FIG. 8B is a plan view for describing a wiring pattern on a multilayered substrate.
Figure 8C:
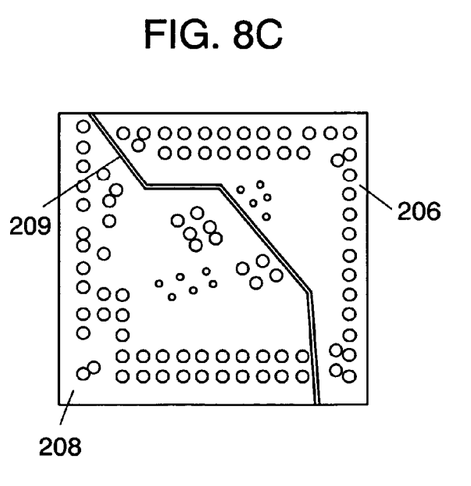
FIG. 8C is a plan view for describing a wiring pattern on a multilayered substrate.
Figure 8D:
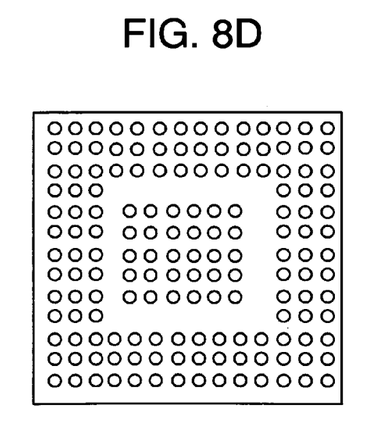
FIG. 8D is a plan view for describing a wiring pattern on a multilayered substrate.

FIGS. 8A to 8D are examples of wiring patterns of each layer of conventional interposers having only a rewiring function. FIGS. 8A, 8B, 8C, and 8D cover the first layer (surface layer), the second layer, third layer, and the fourth layer (bottom layer), respectively. In FIGS. 8A and B, there are a large number of rewirings involved in wiring bonding, some of which are not shown. The first layer shown in FIG. 8A is a layer to which information from all pad electrodes of semiconductor device 109 and semiconductor device 116 is connected through a wire with all of a signal line, a power line and a grounding line included. As shown in FIG. 8A, first power terminal 202, second power terminal 204 and grounding electrode 203 are concentrated and disposed directly under the semiconductor device. Electrode 201 for the signal line is mainly formed in the outer periphery. The second layer shown in FIG. 8B is a grounding electrode layer. The layer is basically composed of grounding electrode 205 and the power line and the signal pass through the layer so that these lines avoid grounding electrode 205. The third layer shown in FIG. 8C is a power layer. The layer is composed of two power electrodes 208 and 206, each of which is independently present in a region separated by boundary 209. The grounding electrode and the signal line pass through the layer so that the grounding electrode and the signal line avoid power electrodes 208 and 206. The fourth layer shown in FIG. 8D is composed of pad electrodes to be mounted on the mother board. The layer includes all of the signal line, the power line, and the grounding line. Individual pads are arranged on the layer in much the same way as in the first layer.

Figure 9A:
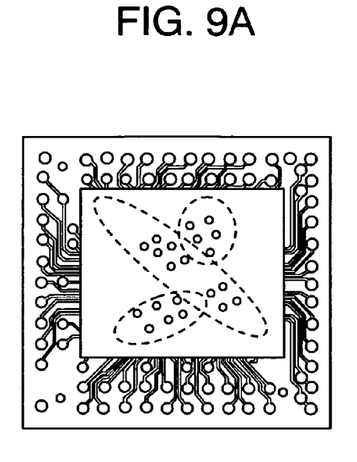
FIG. 9A is a plan view for describing a wiring pattern on a multilayered substrate used for a semiconductor unit according to an embodiment of the invention.
Figure 9B:
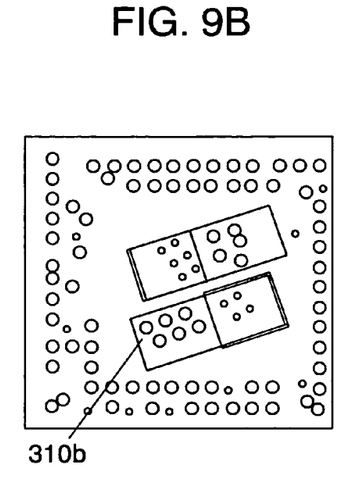
FIG. 9B is a plan view for describing a wiring pattern on a multilayered substrate used for a semiconductor unit according to an embodiment of the invention.
Figure 9C:
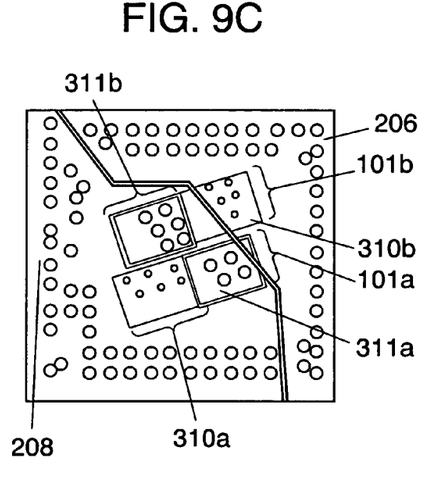
FIG. 9C is a plan view for describing a wiring pattern on a multilayered substrate used for a semiconductor unit according to an embodiment of the invention.

In the multilayered substrate according to the invention, solid electrolytic capacitor 101a and a wiring pattern with solid electrolytic capacitor 101a built in are shown in FIGS. 9A to 9D. As shown in FIGS. 9A to 9D, an interposer substrate having two large-capacity capacitors built in can be designed with little change to the wiring pattern. As shown in FIGS. 9B and 9C, solid electrolytic capacitor 101a and solid electrolytic capacitor 101b are disposed on an electrode pattern. Anode electrode portion 310a, anode electrode portion 310b, and cathode portion 313 of each solid electrolytic capacitor are formed to fit in each power electrode region 208.

As shown in FIG. 9C, portions 310a and 310a of the anode portion of an aluminum electrolytic capacitor which are connected to the power electrodes of the substrate are formed in a region of each of the power electrodes.

It should be noted that a grounding electrode should be used instead of a power electrode in a portion directly below portions 311a and 311b where the grounding electrode is formed in solid electrolytic capacitor 101a and solid electrolytic capacitor 101b.

Figure 9D:
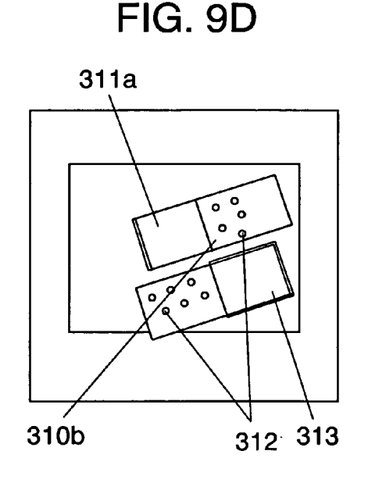
FIG. 9D is a plan view showing the disposition of solid electrolytic capacitors.

FIG. 9D shows the shape arrangement of built-in SPC elements. Through hole electrode 312 is connected to the anode through a through hole. Cathode portion 313 is formed and coated with silver paste.

As described above, the design of an interposer substrate having built-in solid aluminum electrolytic capacitors shown in FIGS. 2A and 2B can be performed with little change to wiring patterns of glass-epoxy multilayered substrate 155 having a rewiring function as shown in FIGS. 9A to 9D.

Actually, a semiconductor package using an interposer having built-in solid electrolytic capacitor 101a and solid electrolytic capacitor 101b was mounted on a main board for power supply noise evaluation. It was then confirmed that power supply noises can be substantially reduced in a range of low-frequency noises to high-frequency noises. As a result, it was confirmed that radiation noises coming from the main board can be reduced by 10 dB or more. It could also be confirmed that a fluctuation in semiconductor supply voltage is reduced.

The present invention has a low ESL function. The invention can therefore prevent a signal line from passing through the capacitive layer of a solid electrolytic capacitor and can address a system having a large number of power systems. Capacitors are also disposed between the power layer and grounding layer. The foil-like metal substrate of the solid electrolytic capacitor is connected with the power electrode of the multilayered substrate through through-hole vias or conductive resin material. An interposer having only a rewiring function can therefore be designed with little change to wiring. In addition, a built-in capacitor element having a large capacity in the order of μF can be provided on the substrate. The embodiment can combine almost all of further noise reduction effect of a semiconductor device mounted, and capacitor functions as a measure against noises. Therefore, the number of parts can be substantially reduced in terms of an electronic unit.

According to the present invention, it is possible to conveniently design, manufacture and provide a multilayered substrate having a built-in large-capacity capacitor composed of a solid electrolytic capacitor between the power layer and the grounding layer of an interposer substrate.

The invention claimed is:

1. A multilayered substrate comprising:
    a first circuit board having an upper surface and a lower surface, the upper surface of the first circuit board having a first wiring layer provided thereon, the lower surface of the first circuit board having a second wiring layer provided thereon;
    a second circuit board having an upper surface and a lower surface, the upper surface of the second circuit board having a third wiring layer provided thereon, the lower surface of the second circuit board having a fourth wiring layer provided thereon;

a solid electrolytic capacitor having an insulative oxide film layer, an electrolytic layer, and a conductor layer sequentially formed on one surface of a foil-like metal substrate and an electrode layer formed on the other surface of the foil-like metal substrate, the foil-like metal substrate being made of aluminum, the electrode layer being made of plated Cu or plated Ni; and a first conductive substance passing through the first circuit board, the second circuit board, the foil-like metal substrate, and the electrode layer, the first conductive substance being connected to the foil-like metal substrate and the electrode layer;

wherein the solid electrolytic capacitor is disposed to be held between the first circuit board and the second circuit board;

wherein the second wiring layer includes a grounding layer connected to the conductor layer; and wherein the third wiring layer includes a power layer connected to the first conductive substance.

2. A semiconductor package using a multilayered substrate of claim 1.

3. The multilayered substrate of claim 1, further comprising a composite layer made of composite material composed of material including resin and an inorganic filler, the composite layer having the solid electrolytic capacitor embedded therein.

4. The multilayered substrate of claim 1, further comprising
a second conductive substance passing through the first circuit board, the second circuit board, the foil-like metal substrate, and the electrode layer, the first conductive substance being connected to the foil-like metal substrate and the electrode layer,
wherein the conductor layer is located between the first conductive substance and the second conductive substance.

5. The multilayered substrate of claim 1, wherein the first conductive substance comprises a through hole plating.

6. The semiconductor package of claim 2, wherein the third wiring layer further includes a grounding pattern connected to the conductor layer.

7. The semiconductor package of claim 2, wherein a semiconductor is mounted by wire bonding technique.

8. The semiconductor package of claim 2, wherein a signal line passing through the multilayered substrate across a thickness thereof is outside a region where the solid electrolytic capacitor is formed.

* * * * *

UNITED STATES PATENT AND TRADEMARK OFFICE
CERTIFICATE OF CORRECTION

PATENT NO. : 7,821,795 B2
APPLICATION NO. : 11/578039
DATED : October 26, 2010
INVENTOR(S) : Yasuhiro Sugaya et al.

Page 1 of 1

It is certified that error appears in the above-identified patent and that said Letters Patent is hereby corrected as shown below:

IN THE CLAIMS

In column 14, line 20 (claim 7, line 2), "bonding technique" should read --bonding--.

Signed and Sealed this
Eighth Day of March, 2011

David J. Kappos
*Director of the United States Patent and Trademark Office*